(12) United States Patent
Driemel

(10) Patent No.: US 8,638,100 B2
(45) Date of Patent: Jan. 28, 2014

(54) SURFACE COIL FOR A MAGNETIC RESONANCE TOMOGRAPHY APPARATUS WITH INTERCHANGEABLE OPERATING ELEMENTS AND A SIMULTANEOUSLY MECHANICAL AND ELECTRICAL LOCKING ELEMENT

(75) Inventor: Daniel Driemel, Oederan (DE)

(73) Assignee: Siemens Aktiengesellschaft, Munich (DE)

( * ) Notice: Subject to any disclaimer, the term of this patent is extended or adjusted under 35 U.S.C. 154(b) by 587 days.

(21) Appl. No.: 12/849,063

(22) Filed: Aug. 3, 2010

(65) Prior Publication Data
US 2011/0040174 A1 Feb. 17, 2011

(30) Foreign Application Priority Data
Aug. 11, 2009 (DE) .................. 10 2009 036 939

(51) Int. Cl.
*G01R 33/36* (2006.01)
(52) U.S. Cl.
USPC .......................................... 324/318; 324/322
(58) Field of Classification Search
USPC ............... 324/300–322; 600/407–435; 606/1; 424/426
See application file for complete search history.

(56) References Cited

U.S. PATENT DOCUMENTS

| | | | | |
|---|---|---|---|---|
| 4,956,609 A * | 9/1990 | Miyajima | ...................... | 324/322 |
| 5,664,568 A * | 9/1997 | Srinivasan et al. | ............ | 324/322 |
| 5,783,943 A * | 7/1998 | Mastandrea et al. | .......... | 324/318 |
| 6,011,393 A * | 1/2000 | Kaufman et al. | ............. | 324/318 |
| 6,316,941 B1 * | 11/2001 | Fujita et al. | .................... | 324/318 |
| 6,577,888 B1 * | 6/2003 | Chan et al. | ..................... | 324/318 |
| 6,591,128 B1 * | 7/2003 | Wu et al. | ....................... | 600/422 |
| 6,750,653 B1 * | 6/2004 | Zou et al. | ..................... | 324/318 |
| 6,784,665 B1 * | 8/2004 | Chan et al. | ..................... | 324/318 |
| 6,788,057 B1 * | 9/2004 | Petropoulos et al. | ......... | 324/318 |
| 6,943,551 B2 | 9/2005 | Eberler et al. | ................ | 324/318 |
| 6,980,002 B1 * | 12/2005 | Petropoulos et al. | ......... | 600/422 |
| 7,288,938 B2 * | 10/2007 | Chmielewski et al. | ....... | 324/318 |
| 7,327,142 B2 * | 2/2008 | Robb et al. | ..................... | 324/318 |
| 7,463,031 B2 * | 12/2008 | Kato | ............................. | 324/318 |
| 7,526,330 B1 * | 4/2009 | Randell et al. | ................ | 600/422 |
| 7,666,181 B2 * | 2/2010 | Abou El Kheir | ................ | 606/1 |
| 7,826,887 B2 * | 11/2010 | Driemel | ........................ | 600/422 |
| 7,906,966 B1 * | 3/2011 | Votruba | ........................ | 324/318 |
| 7,970,452 B2 * | 6/2011 | Piron et al. | .................... | 600/411 |
| 2005/0030022 A1 * | 2/2005 | Robb et al. | ..................... | 324/318 |
| 2006/0147492 A1 * | 7/2006 | Hunter et al. | ................. | 424/426 |
| 2007/0016003 A1 * | 1/2007 | Piron et al. | .................... | 600/415 |
| 2007/0090840 A1 * | 4/2007 | Chmielewski et al. | ....... | 324/318 |
| 2008/0136412 A1 * | 6/2008 | Kato | ............................. | 324/318 |
| 2008/0287926 A1 * | 11/2008 | Abou El Kheir | ................ | 606/1 |
| 2008/0306377 A1 * | 12/2008 | Piron et al. | .................... | 324/318 |
| 2011/0012598 A1 * | 1/2011 | van Helvoort et al. | ....... | 324/318 |
| 2011/0040174 A1 * | 2/2011 | Driemel | ........................ | 600/422 |
| 2011/0257513 A1 * | 10/2011 | Toddes et al. | ................. | 600/415 |
| 2011/0279119 A1 * | 11/2011 | Driemel et al. | ............... | 324/318 |
| 2012/0153956 A1 * | 6/2012 | Driemel | ........................ | 324/322 |
| 2012/0172704 A1 * | 7/2012 | Piron et al. | .................... | 600/410 |

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

An assembly for mounting and unmounting a surface coil of a magnetic resonance tomography apparatus includes an upper part, a lower part, a locking element to fix the upper part and the lower part to one another, and contact elements at the upper part and at the lower part. The contact elements at the upper part can be brought into an electrically conductive connection with contact elements at the lower part and the upper part and the lower part can be fixed to one another by a movement of the locking element.

16 Claims, 9 Drawing Sheets

SURFACE COIL FOR A MAGNETIC RESONANCE TOMOGRAPHY APPARATUS WITH INTERCHANGEABLE OPERATING ELEMENTS AND A SIMULTANEOUSLY MECHANICAL AND ELECTRICAL LOCKING ELEMENT

BACKGROUND OF THE INVENTION

1. Field of the Invention

The invention concerns a surface coil for a magnetic resonance tomography apparatus.

2. Description of the Prior Art

Magnetic resonance apparatuses, in particular for the examination of patients via magnetic resonance tomography, are generally known from DE10314215B4, for example.

Modern magnetic resonance systems (also called MR or MRT) normally operate with multiple different antennas (also called coils in the following) to emit radio-frequency pulses for nuclear magnetic resonance and/or to acquire induced magnetic resonance signals. A magnetic resonance system frequently possesses a larger coil (what is known as a whole-body coil, also called a body coil or BC) that is normally permanently installed in the apparatus, as well as multiple small surface coils (also called local coils). In contrast to the whole-body coil, surface coils serve to acquire detailed images of body parts or, respectively, organs of a patient that are located relatively near to the surface of the body. For this purpose surface coils are applied at the point of the patient at which a region to be examined is located.

Surface coils for magnetic resonance tomography often are composed of multiple coil parts. For example, head coils or knee coils are typically divided into a lower part and an upper part for a facilitated entrance for the patient. These parts are attached during an MRT measurement to fix their position. Locking elements are, for example, latch levers that are borne such that can be displaced or rotated. The coil parts can additionally also possess electrical connections (realized by plug contacts, for example). In order to release these plug contacts upon opening the coil, ejection mechanisms are integrated into the coils. The operation of these movable coil parts is performed by the user of the MRT.

SUMMARY OF THE INVENTION

An object of the present invention to optimize the design of a surface coil.

A surface coil for a magnetic resonance tomography apparatus in accordance with the invention has an upper part, a lower part, a locking element to fix the upper part and the lower part to one another, and contact elements at the upper part and at the lower part, the contact elements at the upper part being configured to be brought into an electrically conductive connection with contact elements at the lower part, and the upper part and the lower part can be fixed to one another by movement of the locking element (in particular an arm).

A particularly simple locking is enabled when the contact elements at the upper part and at the lower part can be brought into electrically conductive connection with one another and the upper part and the lower part can be fixed to one another with only one movement of the locking element.

A particularly simple removal of the upper part and lower part from one another is likewise enabled when the contact elements at the upper part and at the lower part can be separated from one another and the upper part and lower part can be unlocked from one another with a movement of the locking element or arm.

Contact bushings at the upper part and contact pins at the lower part (or vice versa) can advantageously be provided as contact elements.

A mounting or separation of the upper part and lower part without tools is supported if the locking element is an arm with a translation of force applied to it into a force separating the upper part from the lower part and/or the contact elements from one another, in particular with a conversion of approximately one to four.

According to an embodiment of the invention, a latch element and the locking element can only be disengaged if the latch element is located in a position that is displaced against a force of a spring.

According to another embodiment of the invention, the latch element and the locking element advantageously interlock when they are mutually engaged with one another counter to an unwanted disengagement.

Guide pins are advantageously provided in order to assist in the engagement of contact elements at the upper part and at the lower part in one another given an engagement of the upper part and the lower part. Guide pins that are asymmetrical relative to one another enable a coding of upper parts and lower parts in order to avoid confusions of upper parts and lower parts that do not belong together.

DESCRIPTION OF THE PREFERRED EMBODIMENTS

Figure 1:
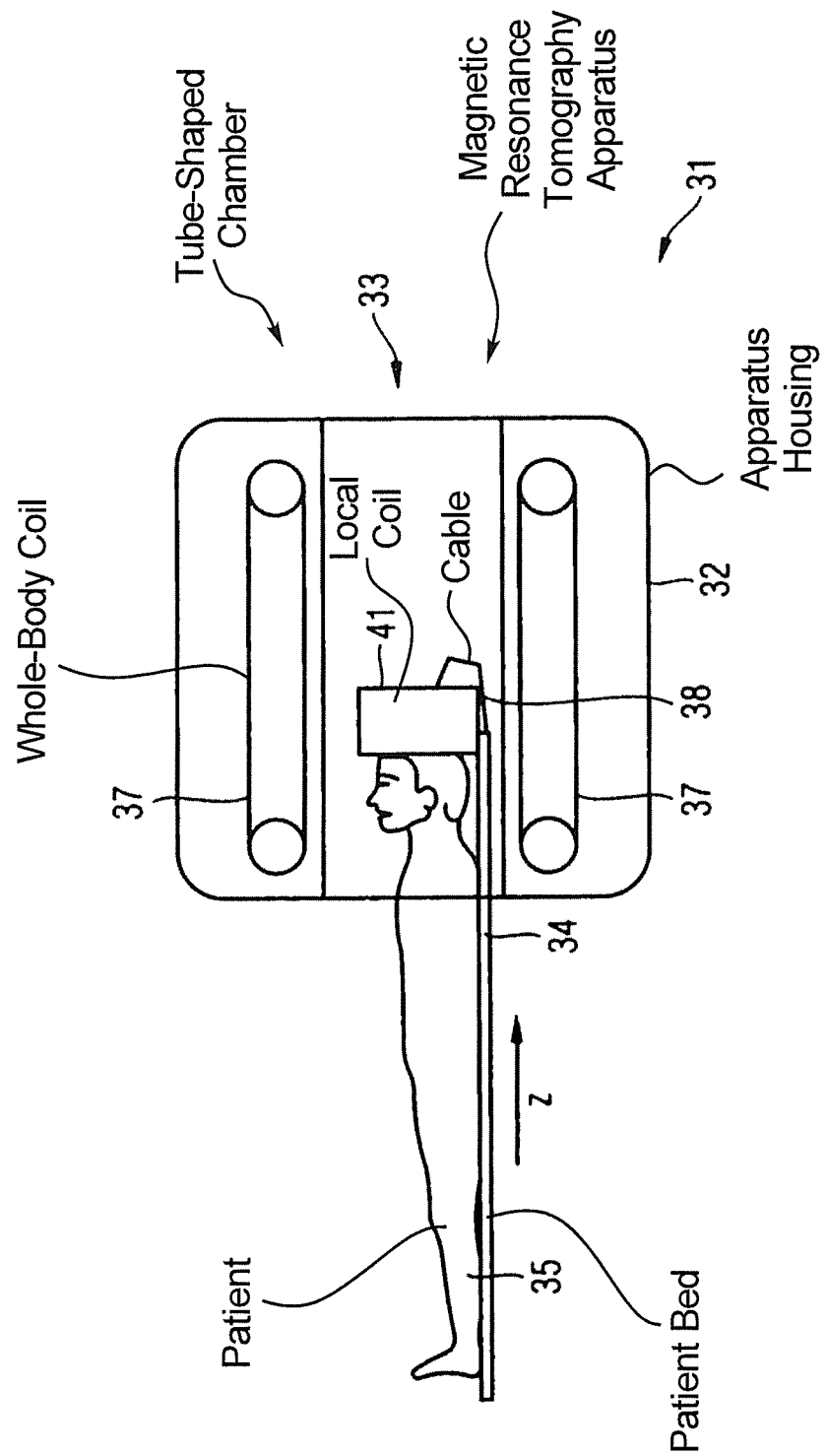
FIG. 1 schematically illustrates an MRT with coils as an overview representation.

FIG. 1 shows a magnetic resonance tomography (MRT) apparatus 31 having an apparatus housing 32 in which a whole-body coil 37 surrounds a tube-shaped chamber 33 into which a patient bed 34 (for example with a patient 35 and a surface or local coil 41) can be driven in order to generate exposures of the patient 35. Here the local coil 41 is in the form of a head coil, with which good exposures are enabled in a local region (here in the head region) is placed on the head of the patient. The local coil 41 can be connected with connector cables 38, for example with terminals in the patient bed 34 or elsewhere on the MRT apparatus 31.

In the following a head coil 41 is described as an exemplary embodiment of a surface coil using FIG. 2-9. Such an embodiment can be used not only in head coils but also in all other MRT surface coils. Elements of the head coil 41 can also be exchanged by a customer on site without having to open its coil housing.

Figure 2:
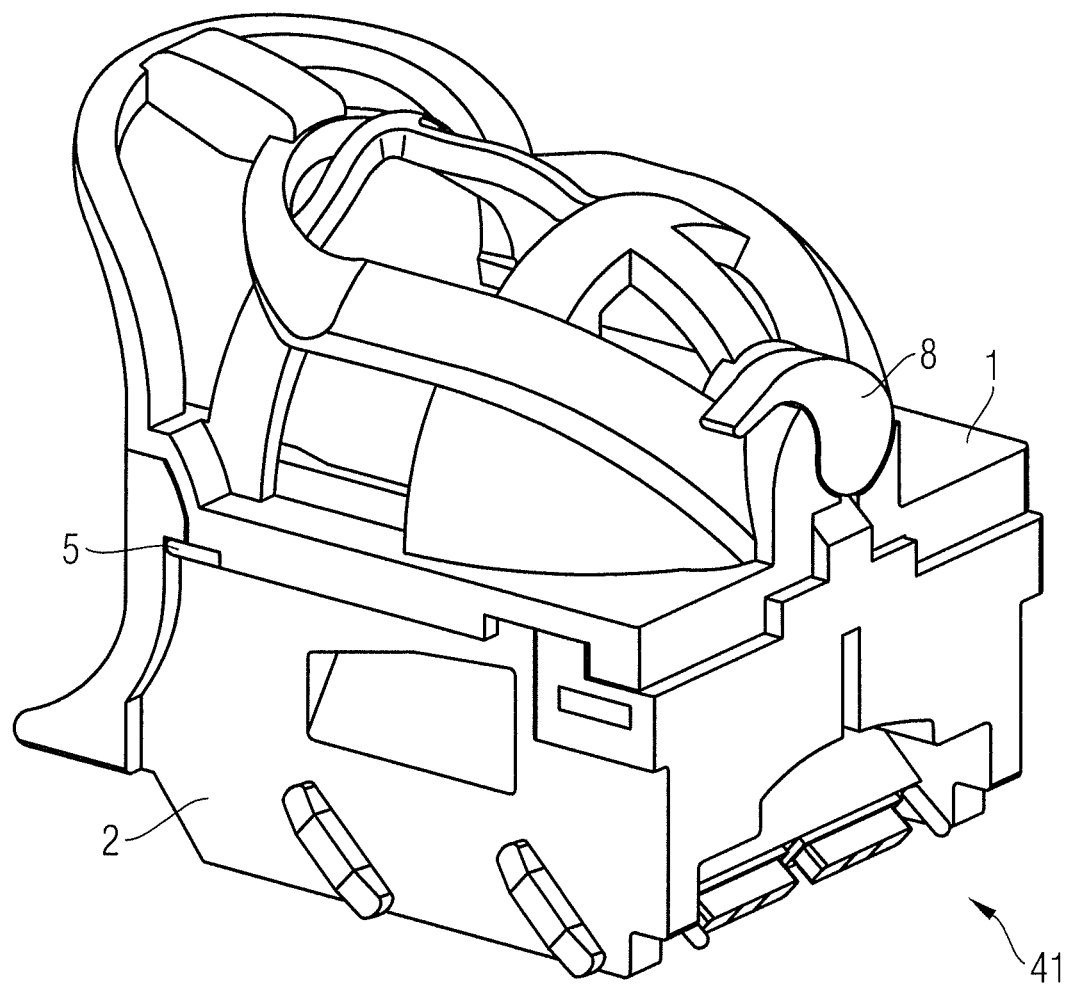
FIG. 2 shows a head coil in plan view.

FIG. 2 shows a head coil 41 that has an upper head coil part 1 and a lower head coil part 2 that form the coil housing, wherein the upper part 1 and the lower part can be fixed (locked/secured etc.) to one another via a locking element (here in the form of an arm 8). An electrical contacting (between structural elements of the upper head coil part 1 and lower head coil part 2) ensues via contact elements (visible in FIG. 3), namely here contact bushings 3 in the lower part 2 and contact pins 4 (visible in FIG. 4) in upper part 1 (or conversely contact pins 4 in the lower part and contact bushings 3 in the lower part 1). Contact bushings 3 and contact pins 4 can engage with one another if the upper part and lower part are fixed (locked/clamped) to one another and establish an electrically conductive connection (for example for elements in the upper part and lower part or interfaces).

A distinctiveness of the head coil 41 is the combination of two functions in an operating movement upon detachment of the upper part 1 of the housing of the head coil 41 from the lower part 2. A rotating movement "O" of an arm 8 in FIG. 2 unlocks the upper coil housing part 1 from the lower coil housing part 2 and, given a further movement "O" of the arm 8 (horizontally in FIG. 2), slides electrical plug contacts out of contact bushings of the lower coil housing part. An efficient placement of the upper part 1 on the lower part 2 with contacting of the contact elements of the upper part 1 and lower part 2 is likewise possible. In spite of the simple exchange capability, the elements (for example 5-17) provided for this are completely integrated into the coil housing formed by the parts 1, 2 and do not require any additional retention parts or bold connections. Via their interplay they prevent an unwanted detachment from the coil housing formed by the parts 1, 2.

Figure 3:
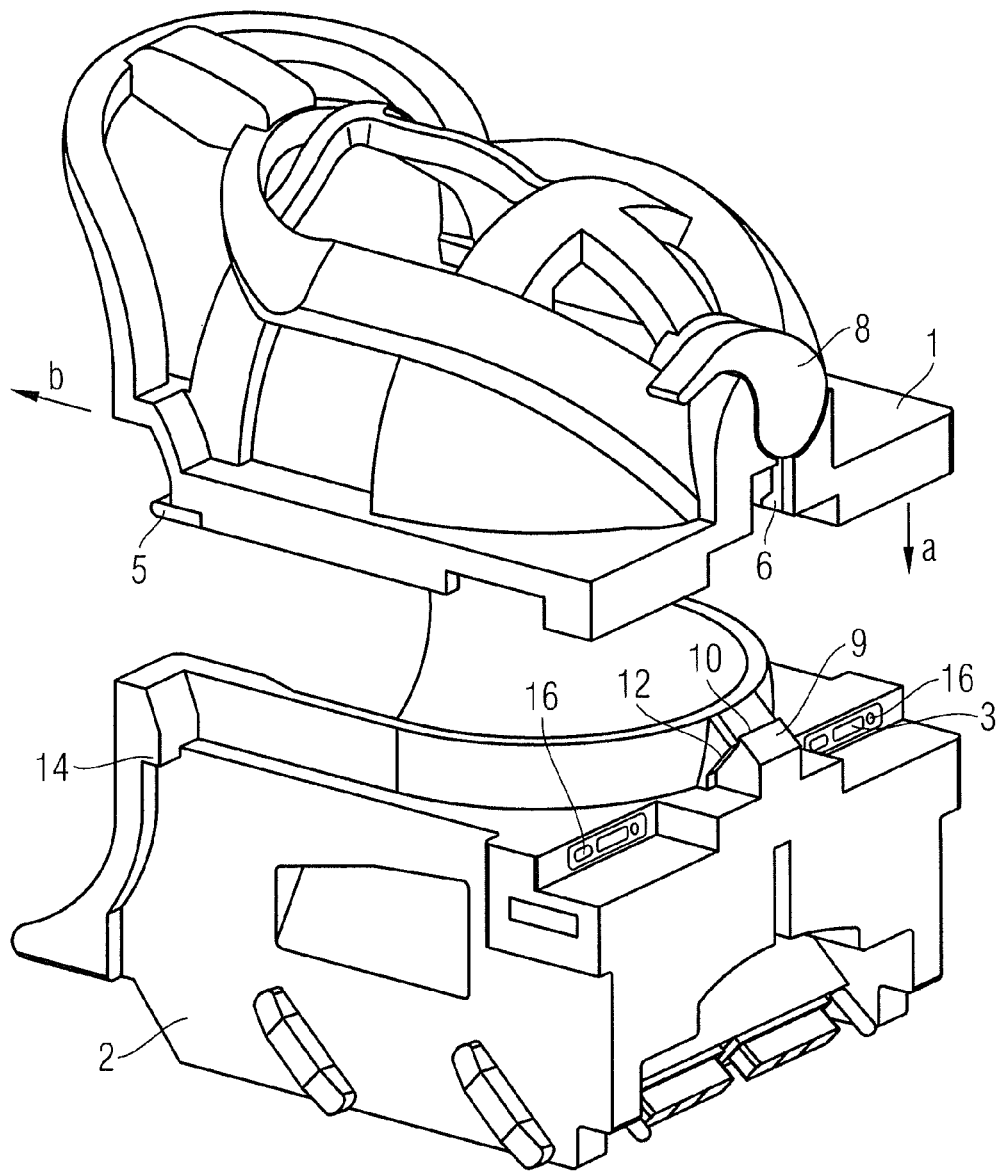
FIG. 3 shows the head coil in a lateral view with an upper head coil part and lower head coil part.
Figure 4:
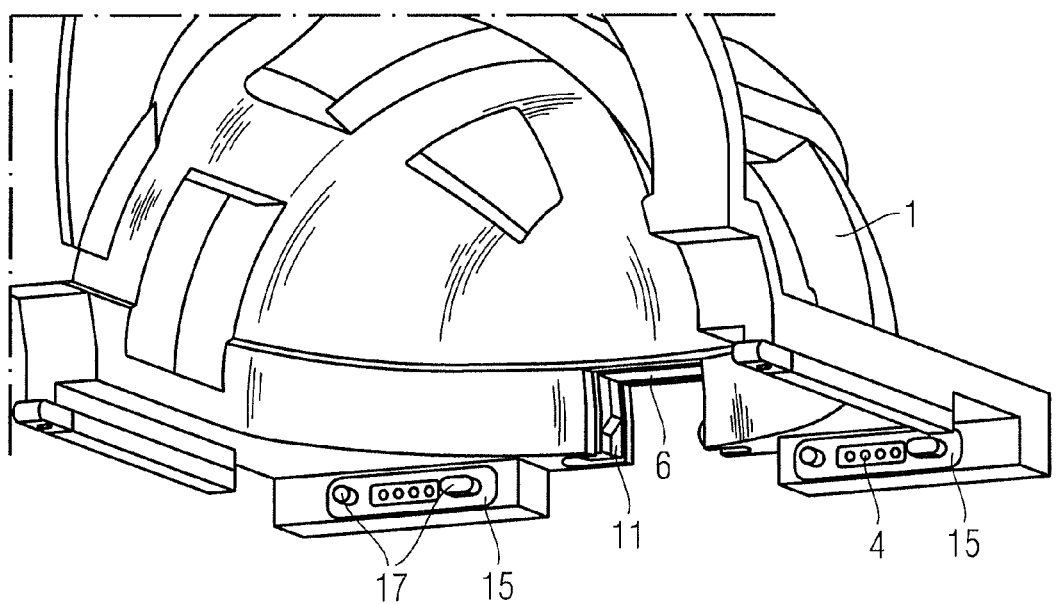
FIG. 4 shows the upper part of the head coil in a lateral view with lower head coil part removed from the upper head coil part.
Figure 5:
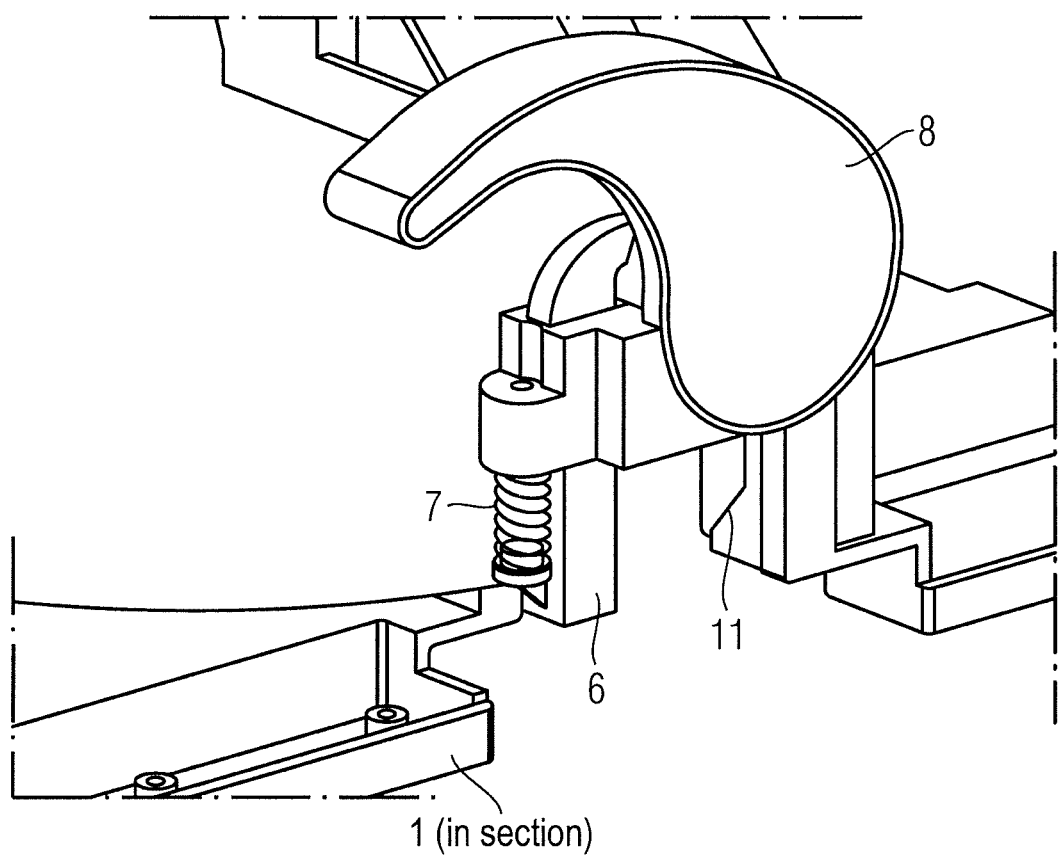
FIG. 5 shows details of a latching mechanism at the upper part of the head coil.
Figure 6:
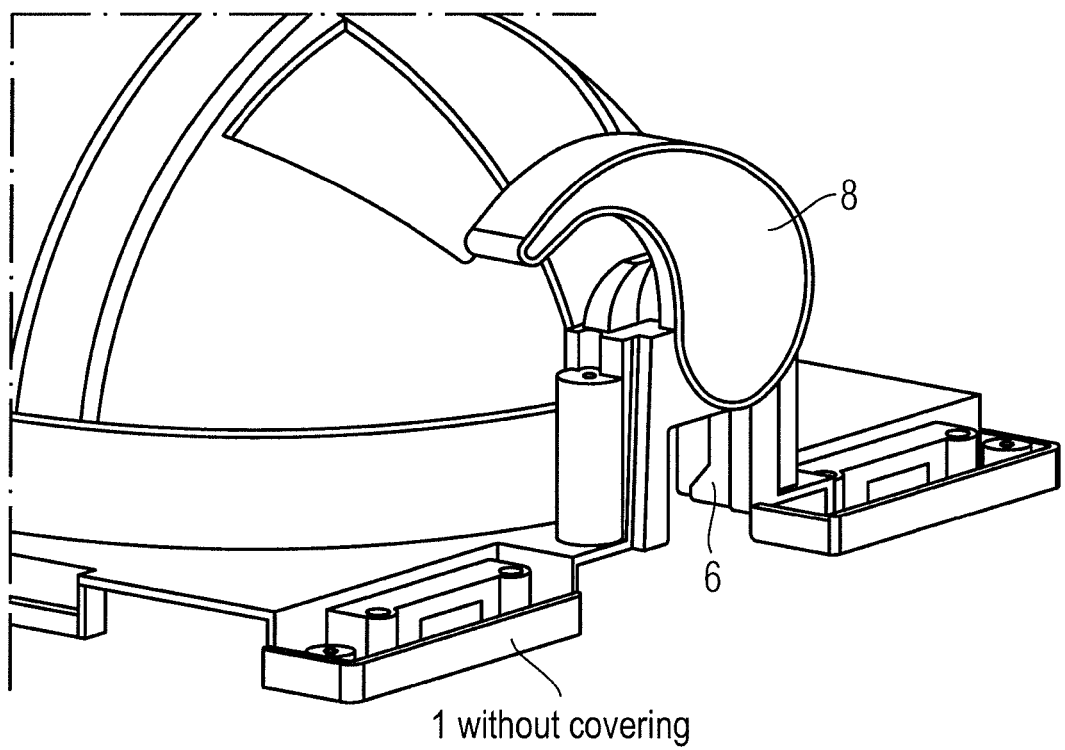
FIG. 6 shows a locking element in the form of an arm.
Figure 7:
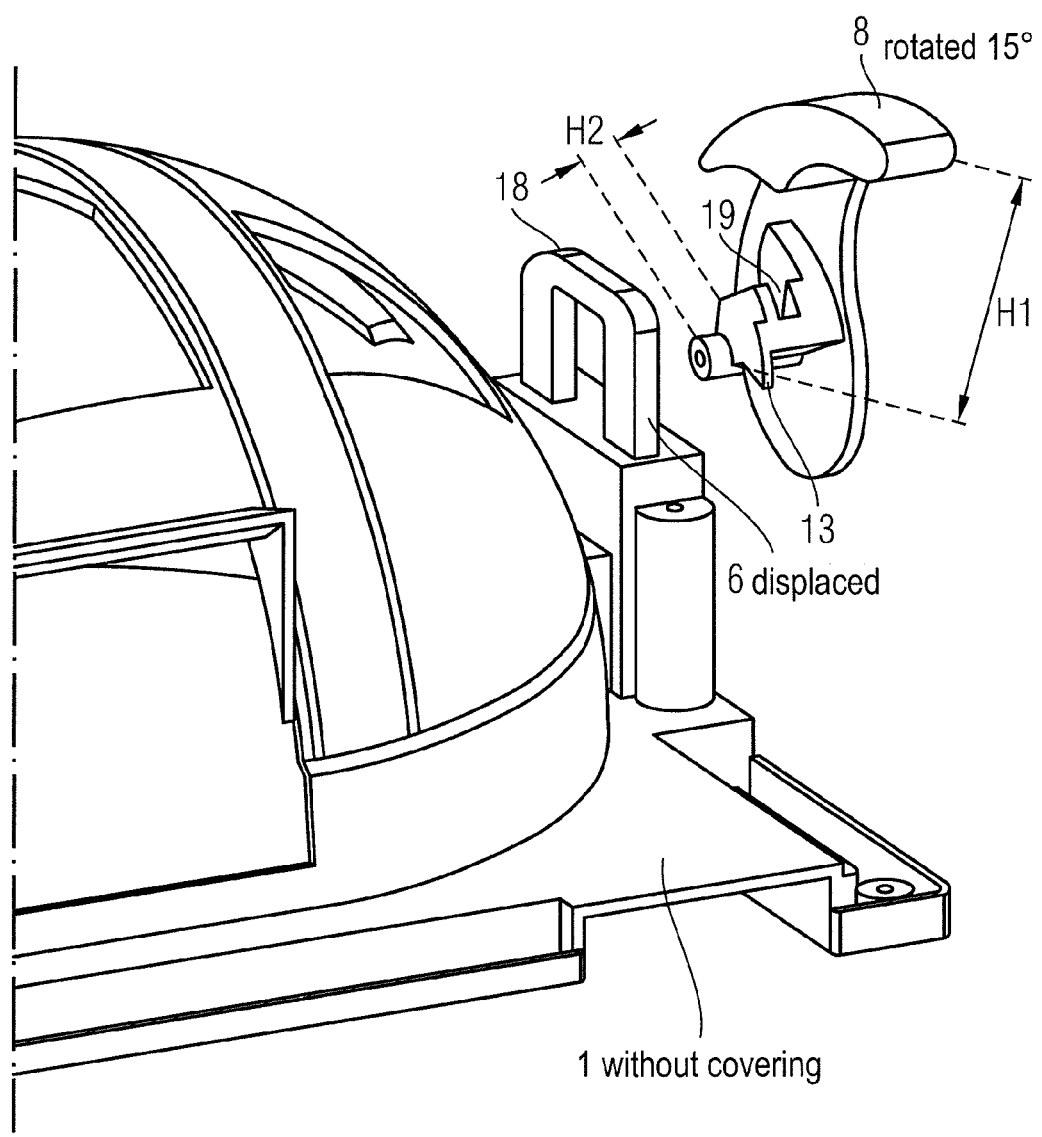
FIG. 7 shows the arm in a position removed from the head coil.

In the plan view in FIG. 3, retention elements 5 on both sides of the upper part 1 ensure a positive placement (for example in the direction of arrow a) of the upper part 1 to the rear (thus to the right in FIG. 3) of plug contacts (contact bushings 3) in the lower part 2. By shifting (for example horizontally in the direction of arrow b) the upper part 1 along the lower part 2 (performed by a user), contact elements (contact bushings 3 and contact pins 4 in the lower part 2 and in the upper part 1) are contacted with one another and retention elements 5 on the upper part 1 slide behind a projecting housing edge 14 (in FIG. 3) of the lower part.

Upon placement of the upper part 1 on the lower part 2 with a horizontal shifting (counter to the direction of the arrow b in FIG. 3 and FIG. 8) of the upper part 1 on the lower part 2 or relative to the lower part 2, the latch element 6 glides upward (in the direction of the arrow "−a) on a slope 9 (in FIG. 3) at the lower part 2 and after this plunges into the groove 10 situated after the slope 9. The upper part 1 is now locked (at the lower part 2; it does not slide down from the lower part 2 counter to the direction of arrow b).

Contact pins 17 on two sides (left and right in FIG. 4) of the plug contacts (the contact elements 4 of the upper part 1) that lead the contact elements 4 in the upper part 1 (upon displacement of the upper part 1 on the lower part 2 in the direction of arrow b) optimize the insertion precision (upon insertion of plug elements 3, 4 into one another during the sliding b of the upper part 1 over the lower part 2). In order to prevent lifting (counter to arrow a) of the upper head coil part 1 during the insertion process (of plug elements 3 and 4 into one another), the length of the guide pins 17 is designed so that they already dip into bushings (into plug elements on the lower part) before the slope 9 (in the form of a displacement of the latch element 6) is effective.

An asymmetrical shaping of the guide pins 17 and/or a rotation capability of a complete plug module 15 (comprising contact elements 4 and contact pins in the event that they are present) and an entire bushing module 16 (comprising contact elements 4 and, in the event that they are present, guide bushings to receive guide pins) achieve the capability of a coding in the manner that only specific upper coil parts can be plugged into specific lower coil parts. For example, this coding can be used as a frequency coding—and therefore as a differentiation between 1.5 T and 3 T coils (for example such that a 3 T upper coil part can only be plugged into a 3 T lower coil part)—in order to avoid errors to the effect that an upper part and a lower part that do not belong together are plugged into one another.

The arm 8 is moved (rotated) by approximately 60° in a rotation movement "O" to open the local coil arrangement 41 (thus to remove the upper part 1 from the lower part 2). The rotation movement "O" of the arm 8 produces a shifting movement (counter to the direction of arrow a) of the latch element 6 by approximately 20 mm. The first 5 mm of the shifting movement unlock the coil 41 (a cross-web 18 of the latch element 6 emerges from the groove 19 at arm 8). An additional 15 mm of the sliding movement shift the upper part 1 counter to the direction of arrow b via slope 11 at the latch element 6 and slope 12 at the lower coil part 2 and thus separate the contact elements 3, 4 of the upper part and lower part from one another. The mechanism requires little expenditure of force given a translation of approximately 4:1 (for example the lever arms H1, H2 of the arm 8 for manual force application and at the cross-web 18 of the latch element 6). Even coil parts with a large number of plug contacts (such as high-channel coils) can thus be moved or unlocked with little force.

Figure 8:
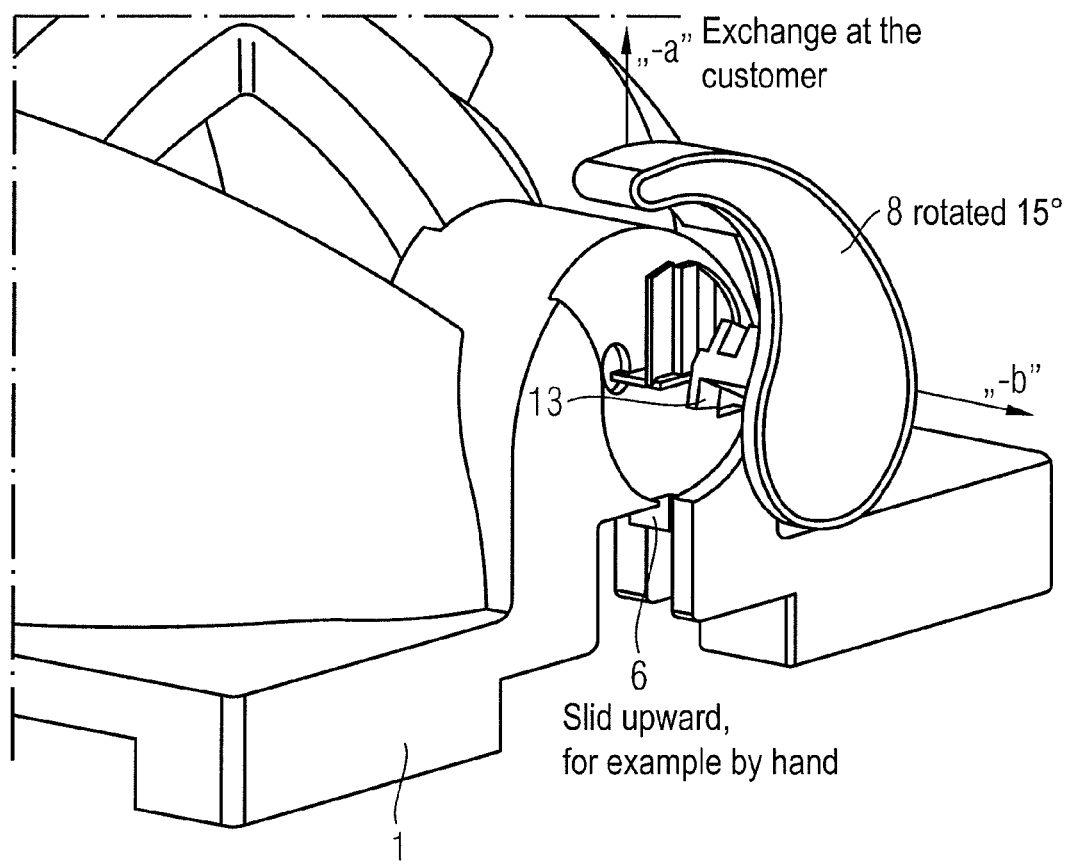
FIG. 8 illustrates an exchange of an arm.
Figure 9:
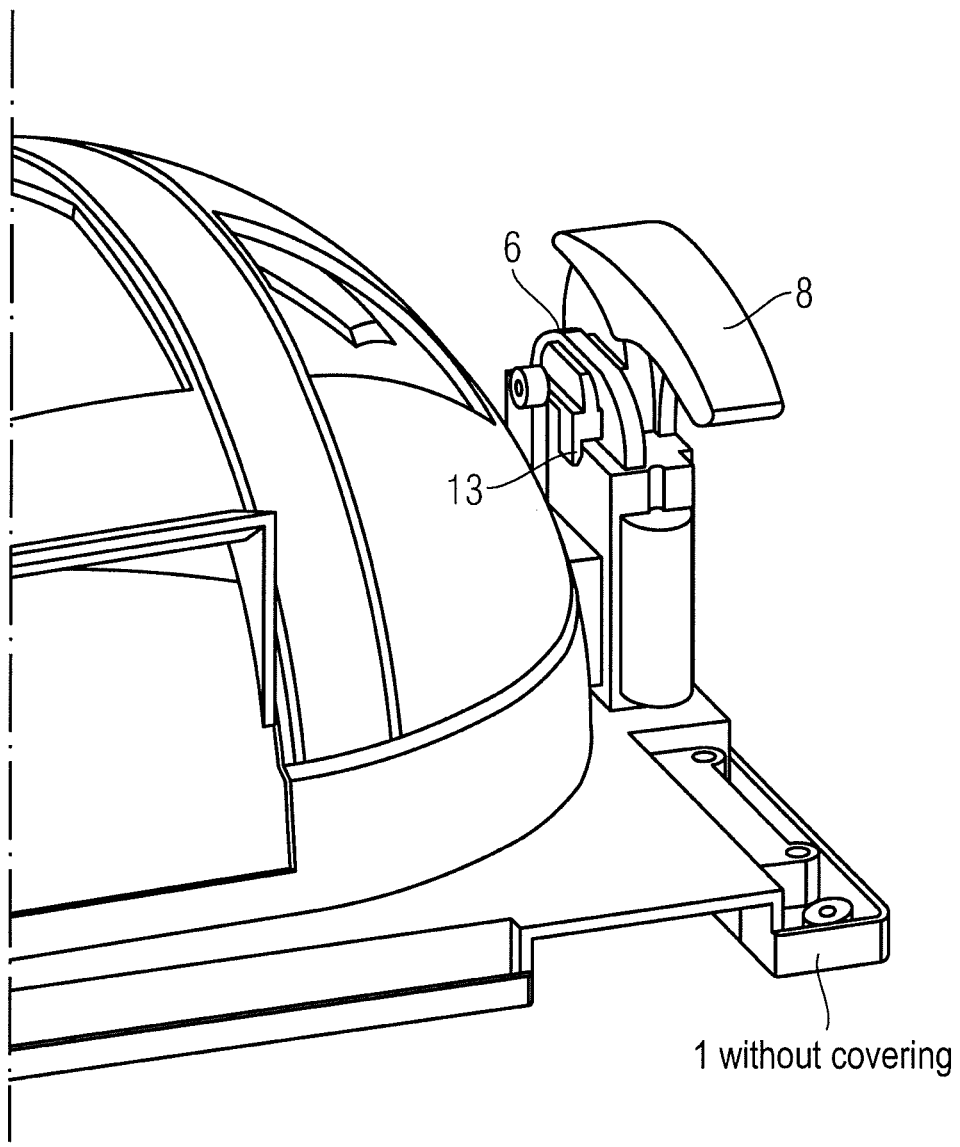
FIG. 9 shows the head coil without covering.

A latch element 6 can be moved vertically into the upper part 1. It is pressed in the direction of the lower part 2 by springs 7 (not visible in FIG. 5). The vertical displacement path of the latch element 6 in and opposite the direction of the lower part 2 is limited by an arm 8 (upward and downward in FIG. 7). Upon insertion of an arm 8 into the upper part 1 according to FIG. 7, the latch element 6 is shifted as far as possible from the lower part (or upward in FIG. 7); the springs 7 can thereby be maximally compressed. Given a closed head coil housing (1, 2), a region below the cross-web 18 of the latch element 6 is cleared into which the arm 8 can dip horizontally. By releasing (detensioning) the springs 7—and therefore releasing the latch element 6—a cross-web 18 of the latch element engages in a groove 19 of the arm 8. Both head coil housing parts 1, 2 thus interlock themselves and presumably will not be accidentally unlocked from one another in typical operation of the coil. As FIG. 8 shows, to exchange a defective latch element 6 or arm 8 the latch element 6 is maximally pressed upward (for example with fingers, thus without a tool) counter to an elastic force of the spring 7 in the direction of arrow "−a" and the arm 8 is drawn out horizontally (in the direction of arrow "−b") from a keyhole with rotation of approximately 15° in FIG. 8. The rotation by 15° disengages the securing edge 13 (from the upper part 1). Given an unwanted upward slide of the latch element 6 (in the direction of arrow "−a"), the securing edge 13 prevents the arm 8 from falling out of the upper part 1 whose center of gravity is located on this shown side. By releasing the elastic force of the springs 7, the latch element 6 is slid out of the upper housing part 1 and can likewise be exchanged (depending on the degree of wear).

Although modifications and changes may be suggested by those skilled in the art, it is the intention of the inventor to embody within the patent warranted hereon all changes and modifications as reasonably and properly come within the scope of his contribution to the art.

I claim as my invention:

1. A surface coil configured for a magnetic resonance tomography apparatus, comprising:
   a coil housing;
   a magnetic resonance surface coil contained inside coil housing;
   said coil housing comprising an upper part and a lower part that are separable from each other and that respectively have mating surfaces that engage said upper part and said lower part with each other;
   said coil housing upper part comprising upper part electrical contact elements and said coil housing lower part comprising lower part electrical contact elements that face each other when said coil housing upper part is placed on said coil housing lower part;
   a manually operable locking element located at one of said coil housing upper part or said coil housing lower part and being configured, when manually operated, to proceed through a movement, that produces a relative movement between said coil housing upper and coil housing lower parts in order to simultaneously bring said coil housing upper part electrical contact elements into electrically conductive connection with said coil housing lower part electrical contact elements and mechanically fix said coil housing upper part and said coil housing lower part in engagement with each other.

2. A surface coil as claimed in claim 1 wherein said movement comprises a rotation movement, and wherein said rotation movement brings said coil housing upper part electrical contact elements into said electrically conductive connection with said coil housing lower part electrical contact elements.

3. A surface coil as claimed in claim 1 wherein said locking element is configured to simultaneously bring said coil housing upper part electrical contact elements into said electrically conductive connection with said coil housing lower part electrical contact elements, and configured to mechanically fix said coil housing upper part and said coil housing lower part in engagement with each other, by only a single movement of said locking element.

4. A surface coil as claimed in claim 1 wherein said movement is a locking movement, and
   wherein said locking element is configured to execute an unlocking movement in a direction opposite to said locking movement that separates said coil housing upper part electrical contact elements from said coil housing lower part electrical contact elements, and that also mechanically disengages said coil housing upper part and said coil housing lower part from each other.

5. A surface coil as claimed in claim 1 wherein said coil housing upper part is displaced onto said coil housing lower part by said movement of said locking element, and wherein said coil housing upper part comprises a plurality of retention elements that positively fit said coil housing upper part onto said coil housing lower part as said coil housing upper part and said coil housing lower part are brought into engagement with each other by said movement of said locking element.

6. A surface coil as claimed in claim 1 wherein said coil housing upper part electrical contact elements and said coil housing lower part electrical contact elements are selected from the group consisting of:
   contact bushings at said coil housing upper part and contact pins at said coil housing lower part, and
   contact pins at said coil housing upper part and contact bushings at said coil housing lower part.

7. A surface coil as claimed in claim 1 wherein said locking element comprises:
   a rotatively mounted arm, and
   wherein said movement is a locking movement executed by said rotatively mounted arm and
   wherein said rotatively mounted arm is mounted IN ORDER to execute an unlocking movement in a direction opposite to said locking movement, and
   wherein said rotatively mounted arm is mechanically configured to move said rotatively mounted arm in said unlocking direction, in order to translate a force that is manually applied thereto into a larger force that mechanically separates said coil housing upper part from said coil housing lower part, and mechanically separates said coil housing upper part electrical contact elements from said coil housing lower part electrical contact elements.

8. A surface coil as claimed in claim 1 wherein said locking element is mounted on said coil housing upper part.

9. A surface coil as claimed in claim 1, comprising:
   a mechanical latch element that engages said locking element when said locking element executes said movement.

10. A surface coil as claimed in claim 9, comprising:
    a spring in mechanical contact with said latch element that exerts a spring force on said latch element counter to a force that brings said latch element into engagement with said locking element.

11. A surface coil as claimed in claim 10 wherein said latch element and said locking element are disengaged from each other only, when said latch element is in a position wherein said latch element is displaced by said spring force.

12. A surface coil as claimed in claim 11 wherein said movement of said locking element engages said latch element and said locking element counter to the displacement of said position of said latch element.

13. A surface coil as claimed in claim 9 wherein said latch element is located on said coil housing upper part.

14. A surface coil as claimed in claim 1 comprising guide pins that guide said coil housing upper part electrical contact elements into electrical contact with said coil housing lower part electrical contact elements, during said movement of said locking element.

15. A surface coil as claimed in claim 14 wherein said guide pins are respectively located at positions that are asymmetrical relative to each other.

16. A surface coil as claimed in claim 1 wherein said manually operable locking element is configured to, when manually operated, produce a horizontal relative movement between said coil housing upper and said coil housing lower parts, as said relative movement that simultaneously brings said coil housing upper part electrical contacts into electrically conductive connection with said coil housing lower part electrical contact elements and mechanically fixes said coil housing upper part and said coil housing lower part into engagement with each other.

* * * * *